(12) United States Patent
Kawasaki

(10) Patent No.: US 9,883,589 B2
(45) Date of Patent: Jan. 30, 2018

(54) WIRING BOARD, AND ELECTRONIC DEVICE

(71) Applicant: KYOCERA Corporation, Kyoto-shi, Kyoto (JP)

(72) Inventor: Kouichi Kawasaki, Kyoto (JP)

(73) Assignee: Kyocera Corporation, Kyoto (JP)

(*) Notice: Subject to any disclaimer, the term of this patent is extended or adjusted under 35 U.S.C. 154(b) by 160 days.

(21) Appl. No.: 14/764,795

(22) PCT Filed: Jul. 30, 2014

(86) PCT No.: PCT/JP2014/070141
§ 371 (c)(1),
(2) Date: Jul. 30, 2015

(87) PCT Pub. No.: WO2015/016289
PCT Pub. Date: Feb. 5, 2015

(65) Prior Publication Data
US 2015/0373846 A1    Dec. 24, 2015

(30) Foreign Application Priority Data

Jul. 30, 2013   (JP) ................................. 2013-157862

(51) Int. Cl.
*H05K 7/10* (2006.01)
*H05K 1/11* (2006.01)
(Continued)

(52) U.S. Cl.
CPC ............. *H05K 1/111* (2013.01); *H01L 23/13* (2013.01); *H01L 23/24* (2013.01);
(Continued)

(58) Field of Classification Search
CPC ... H01L 23/49838; H05K 1/111; H05K 1/116; H05K 2201/10613; H05K 2201/09381
(Continued)

(56) References Cited

U.S. PATENT DOCUMENTS 6,362,435 B1* 3/2002 Downey ........... H01L 23/49811
174/260
7,629,671 B2* 12/2009 Tanaka ............... H01L 21/4853
257/622
(Continued)

FOREIGN PATENT DOCUMENTS

JP    57-034653 B2    7/1982
JP    05-102626 A    4/1993
(Continued)

OTHER PUBLICATIONS

Japanese Office Action with English concise explanation, Japanese Patent Application No. 2015-529607, dated Jun. 7, 2016, 10 pgs.
(Continued)

*Primary Examiner* — Binh Tran
(74) *Attorney, Agent, or Firm* — Volpe and Koenig, P.C.

(57) ABSTRACT

A wiring board has an insulation base plate, and a plurality of electrodes provided adjacent to each other in plan view on the insulation base plate, the electrodes have an opening in the outer periphery and a slit oriented from the outer periphery to the interior, and, among two electrodes adjacent to each other, the slit in one electrode has a central line intersecting the outer periphery of the other electrode.

11 Claims, 10 Drawing Sheets

(51) Int. Cl.

| | | |
|---|---|---|
| *H01L 23/13* | (2006.01) | |
| *H01L 23/498* | (2006.01) | |
| *H01L 23/24* | (2006.01) | |
| *H01L 23/00* | (2006.01) | |
| *H05K 3/34* | (2006.01) | |
| *H05K 1/18* | (2006.01) | |
| *H05K 1/02* | (2006.01) | |
| *H01R 9/00* | (2006.01) | |
| *H01L 23/48* | (2006.01) | |
| *H05K 3/24* | (2006.01) | |
| *H05K 3/46* | (2006.01) | |

(52) U.S. Cl.
CPC ........ *H01L 23/49838* (2013.01); *H01L 24/32* (2013.01); *H05K 1/0209* (2013.01); *H05K 1/181* (2013.01); *H05K 3/3431* (2013.01); *H01L 2224/48091* (2013.01); *H01L 2224/48137* (2013.01); *H01L 2224/73265* (2013.01); *H01L 2224/83385* (2013.01); *H01L 2924/181* (2013.01); *H05K 3/243* (2013.01); *H05K 3/244* (2013.01); *H05K 3/4629* (2013.01); *H05K 2201/094* (2013.01); *H05K 2201/097* (2013.01); *H05K 2201/098* (2013.01); *H05K 2201/09154* (2013.01); *H05K 2201/09163* (2013.01); *H05K 2201/09381* (2013.01); *H05K 2201/09418* (2013.01); *H05K 2201/09663* (2013.01); *H05K 2201/10068* (2013.01); *H05K 2201/10075* (2013.01); *H05K 2201/10106* (2013.01); *H05K 2201/10151* (2013.01); *H05K 2201/2054* (2013.01); *H05K 2203/1178* (2013.01); *Y02P 70/611* (2015.11); *Y02P 70/613* (2015.11)

(58) Field of Classification Search
USPC .......... 361/767, 768, 772, 774; 257/E23.01, 257/E23.06, E23.07, E23.015, 780, 784, 257/786
See application file for complete search history.

(56) References Cited

U.S. PATENT DOCUMENTS

| | | | |
|---|---|---|---|
| 2002/0071935 A1* | 6/2002 | Wu | H05K 1/111 428/134 |
| 2003/0141103 A1 | 7/2003 | Ng et al. | |
| 2007/0221398 A1 | 9/2007 | Karasawa et al. | |
| 2008/0055874 A1 | 3/2008 | Kawade et al. | |
| 2010/0139970 A1 | 6/2010 | Oshima et al. | |
| 2013/0083489 A1 | 4/2013 | Dimauro et al. | |

FOREIGN PATENT DOCUMENTS

| | | |
|---|---|---|
| JP | 09-074267 A | 3/1997 |
| JP | 10-075042 A | 3/1998 |
| JP | 2006-073601 A | 3/2006 |
| JP | 2006-086283 A | 3/2006 |
| JP | 2006-147723 A | 6/2006 |
| JP | 2006-351926 A | 12/2006 |
| JP | 2007-258605 A | 10/2007 |
| JP | 2010-140986 A | 6/2010 |

OTHER PUBLICATIONS

International Search Report, PCT/JP2014/070141, dated Sep. 9, 2014, 2 pgs.
Extended European Search Report, European Patent Application No. 14832154.0, dated Mar. 2, 2017, 11 pgs.

* cited by examiner

SECTION A

WIRING BOARD, AND ELECTRONIC DEVICE

TECHNICAL FIELD

The present invention relates to a wiring board and an electronic device.

BACKGROUND ART

Conventionally, wiring boards with electrodes provided on the surface of an insulation base plate for mounting electronic components are known. For example, electronic components are joined to the electrodes using a joining material such as solder.

Also, in such a wiring board, slits may be provided in the electrodes on which the electronic components are mounted (e.g., see Patent Literature 1).

CITATION LIST

Patent Literature

Patent Literature 1: Japanese Unexamined Patent Publication JP-A 2006-147723

SUMMARY OF INVENTION

Technical Problem

However, in a case where a plurality of electrodes are provided on the surface of an insulation base plate, and a plurality of electronic components are mounted on the electrodes, then for example, if a plurality of electrodes are densely arranged, there is a possibility that gas generated when joining using a joining material such as solder will fill the slits obstructing gas flow, so the gas will not be sufficiently released to the outside, and voids may occur within the joining material.

Solution to Problem

According to a first aspect of the present invention, the wiring board comprises an insulation base plate, and a plurality of electrodes provided adjacent to each other in plan view on the insulation base plate. The electrodes have a slit having an opening on the outer peripheral edge thereof and oriented towards the inner side from the outer peripheral edge. A central line drawn from a slit in one electrode of a pair of adjacent electrodes intersects with the outer peripheral edge of the other electrode.

According to a second aspect of the present invention, the electronic device comprises the wiring board configured as described above, and a plurality of electronic components mounted on each of the electrodes of the wiring board.

ADVANTAGEOUS EFFECT OF INVENTION

According to the wiring board of the first aspect of the present invention, when joining the electronic components to the electrodes using the joining material such as solder, this wiring board can reduce obstruction of gas flow caused by the gas generated from the joining material on adjacent electrodes filling the joining material, thereby achieving good release of the gas to the outside and reducing the occurrence of voids within the joining material.

According to the electronic device of the second aspect of the present invention, the occurrence of voids within the joining material between the electrodes and the electronic components is reduced, so the joining properties between the electronic components and the wiring board is good, and an electronic device can be provided with excellent joining reliability and the heat dissipation properties.

DESCRIPTION OF EMBODIMENTS

The following is a description of several illustrative embodiments of the present invention, with reference to the attached drawings.

(First Embodiment)

As illustrated in FIGS. 1A to 2B, an electronic device according to the first embodiment of the present invention comprises a wiring board 1, and a plurality of electronic components 2 mounted on the wiring board 1. The electronic device is, for example, mounted on a circuit board to configure an electronic component module.

The wiring board 1 comprises an insulation base plate 11, and a plurality of electrodes 12 arranged adjacent to each other in plan view on the insulation base plate 11.

Figure 1A:
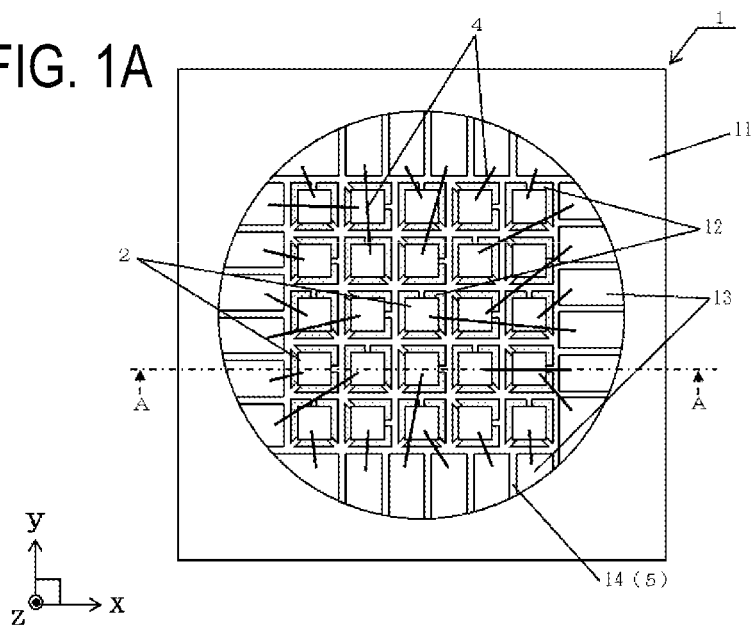
FIG. 1A is a plan view illustrating an electronic device according to a first embodiment of the present invention.
Figure 1B:
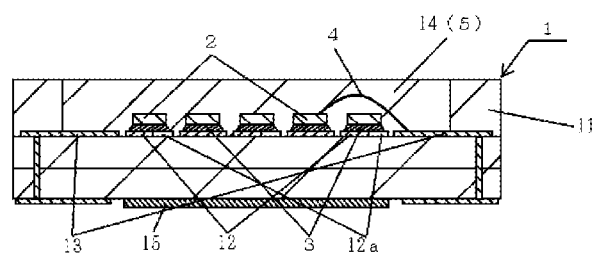
FIG. 1B is a cross-sectional view at the line A-A in FIG. 1A.

The insulation base plate 11 is plate-like with a rectangular external shape when viewed in plan, and as illustrated in FIG. 1B, comprises a pair of main surfaces on the top and bottom thereof, with a cavity 14 provided on the main surface on the top side. Note that in the first embodiment, the main surface on which the cavity 14 is provided and the bottom surface of the cavity 14 are referred to as the top surface of the insulation base plate 11.

The insulation base plate 11 functions as a support body for supporting the electronic components 2, and the plurality of electrodes 12 are provided adjacent to each other on the bottom surface of the cavity 14 of the top surface of the insulation base plate 11. Each of the electronic components 2 is bonded and fixed to the plurality of electrodes 12 using a joining material 3 such as solder.

Also, as illustrated in FIG. 2, the electrodes 12 have openings 12*b* on the outer peripheral edge thereof with slits 12*a* oriented from the outer peripheral edge towards the inside. A central line 12*c* drawn from one of the slits 12*a* in one electrode 12 of a pair of adjacent electrodes 12 intersects with the outer peripheral edge of the other electrode 12.

For example a ceramic such as an aluminum oxide-based sintered body (alumina ceramic), an aluminum nitride-based sintered body, a mullite-based sintered body, or a glass ceramic sintered body can be used for the insulation base plate 11.

In a case where the insulation base plate 11 is made using a resin material, for example, a fluorine-based resin or the like such as an epoxy resin, a polyimide resin, an acrylic resin, a phenol resin, a polyester resin, or an ethylene tetrafluoride resin can be used.

If the insulation base plate 11 is formed from, for example, an aluminum oxide-based sintered body, it can be manufactured by adding together and mixing the raw material powder such as aluminum oxide, silicon oxide, magnesium oxide, or calcium oxide, an organic binder, a solvent, and the like to form a slurry. The slurry is formed into a sheet by the doctor blade method, the calender roll method, or the like, to obtain a ceramic green sheet. Then, punching processing is carried out on the ceramic green sheet, ceramic green sheets are laminated, and sintered at a high temperature (about 1,600° C.).

The plurality of electrodes 12 are provided adjacent to each other in plan view on the top surface of the insulation base plate 11. Each of the electrodes 12 is for mounting an electronic component 2 using the joining material 3 such as solder. As illustrated in the examples in FIGS. 1A to 2B, 25 electrodes 12 are provided in a lattice form of five columns× five rows on the top surface of the insulation base plate 11.

Also, a wiring conductor 13 is provided on the top surface, the bottom surface, and the interior of the insulation base plate 11. For example, a first end of the wiring conductor 13 is led out from the periphery of the electrode 12 on the top surface of the insulation base plate 11, and a second end of the wiring conductor 13 is led out from the bottom surface of the insulation base plate 11. Also, the wiring conductor 13 comprises a through-hole conductor that passes through the insulation layer from which the insulation base plate 11 is configured and is electrically connected to the first end of the wiring conductor 13 and the second end of the wiring conductor 13. In the example illustrated in FIGS. 1A to 2B, the wiring conductor 13 has a region connected to a connection member 4 for electrically connecting to the electronic component 2, and that does not have a slit 12*a*.

A metal material such as tungsten (W), molybdenum (Mo), manganese (Mn), silver (Ag), or copper (Cu) can be used for the electrodes 12 and the wiring conductor 13. For example, in a case where the insulation base plate 11 is formed from an aluminum oxide-based sintered body, a conductor paste for one of the electrodes 12 and the wiring conductor 13 obtained by adding and mixing a high melting point metal powder such as W, Mo, or Mn with an appropriate organic binder, solvent, and the like can be applied by printing a predetermined pattern by the screen printing method in advance on to the ceramic green sheet that will form the insulation base plate 11. Then by sintering at the same time as the ceramic green sheet that will form the insulation base plate 11, the electrodes 12 or the wiring conductor 13 is formed and bonded at predetermined locations on the insulation base plate 11. In a case where the wiring conductor 13 is a through-hole conductor, it can be formed by forming through-holes in the green sheet by punching processing using a die and a punch or by laser processing, and filling the through-holes with a conductor paste for the wiring conductor 13 using a printing method.

In addition, a plated layer is deposited to the exposed surface of the electrodes 12 and the wiring conductor 13 by an electroplating method. The plated layer is formed from a metal with excellent corrosion resistance and bonding to the connection material, such as nickel, copper, gold, or silver. For example, the thickness of the nickel plated layer is about from 0.5 to 5 μm, or the thickness of the gold plated layer is about from 0.1 to 3 μm. Alternately, a nickel plated layer of about from 1 to 10 μm and a silver plated layer of about from 0.1 to 1 μm can be successively deposited. This plated layer can effectively reduce corrosion of the electrodes 12 and the wiring conductor 13, and strengthen the connection between the electrodes 12 and the electronic components 2 using the joining material 3, the connections between the wiring conductor 13 and the connection member 4 such as a bonding wire, and the connection between the wiring conductor 13 and the wire of an external circuit base plate.

Also, by depositing a copper plated layer of thickness about from 10 to 80 μm onto the electrodes 12 for mounting the electronic components 2, the heat of the electronic components 2 may be radiated well, and by depositing a copper plated layer of thickness about from 10 to 80 μm onto the bottom surface of the wiring conductor 13, the heat may be radiated from the wiring board 1 to the external circuit base plate.

Also, plated layers formed of metals other than those above, for example, a palladium plated layer or the like may be interposed.

Each of the plurality of electrodes 12 are provided with an opening 12*b* on the outer peripheral edge thereof and a slit 12*a* oriented from the outer peripheral edge towards the inside. In the example illustrated in FIGS. 2A, 2B, and 3, the central line 12*c* drawn from a slit 12*a* in one electrode 12 of a pair of adjacent electrodes 12 intersects with the outer peripheral edge of the other electrode 12. This configuration reduces, when joining the electronic components 2 to the electrodes 12 by using the joining material 3 such as solder, obstruction of gas flow caused by the gas generated from the joining material 3 on the adjacent electrodes 12 filling the joining material 3 and facilitates the release so as to spread between the adjacent electrodes 12. In other words, skillfully releasing the gas to the outside prevents voids within the joining material 3 from occurring. Here, the central line 12*c* drawn from the slit 12*a* is the line that passes through the center in the width direction of the slit 12*a*. When the slit 12*a* is a straight line, the central line 12*c* is the straight line extended from the opening 12*b* of the slit 12*a*. When the slit 12*a* is curved, the central line 12*c* indicates the line extended in a straight line in the tangential direction from the opening 12*b* of the slit 12*a*.

Figure 2A:
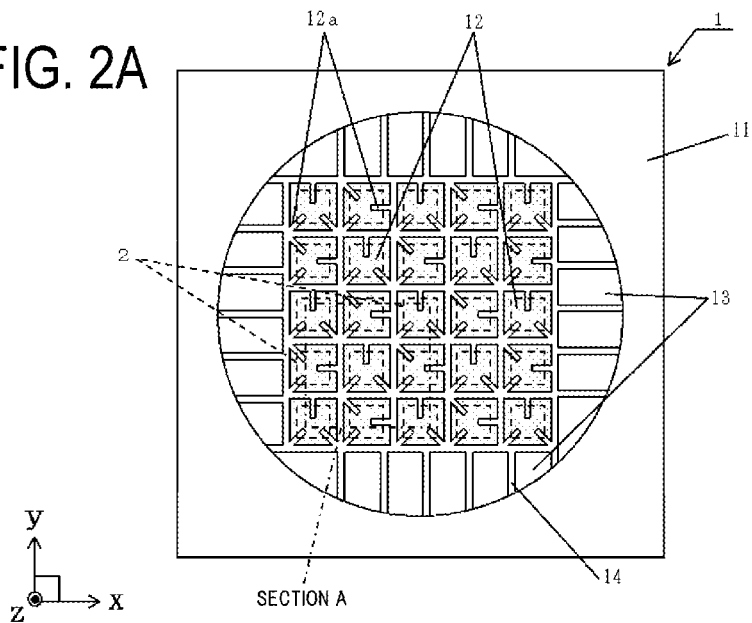
FIG. 2A is a plan view illustrating the wiring board of the electronic device illustrated in FIG. 1A.
Figure 2B:
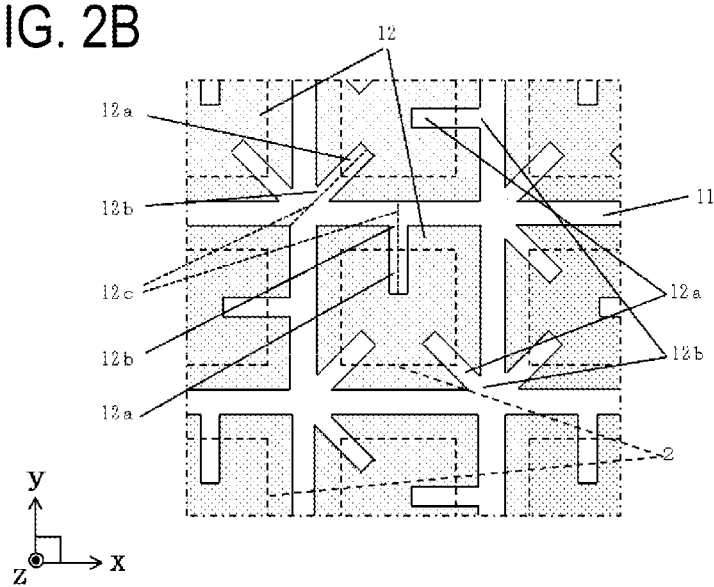
FIG. 2B is an enlarged top view of the main part at section A in FIG. 2A.
Figure 3A:
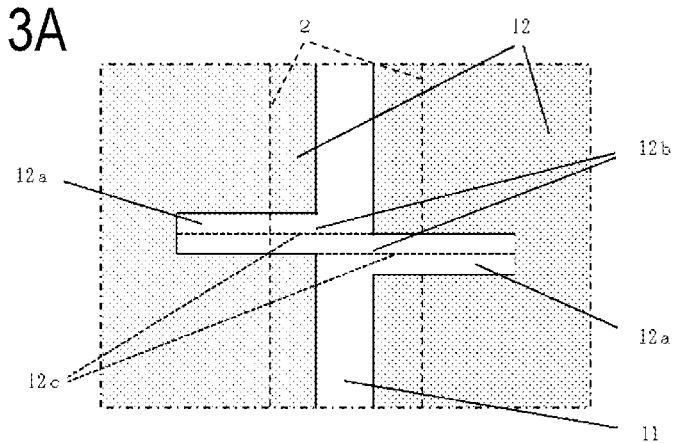
FIGS. 3A and 3B are enlarged plan views of the main part illustrating another example of the wiring board of the electronic device according to the first embodiment of the present invention.
Figure 3B:
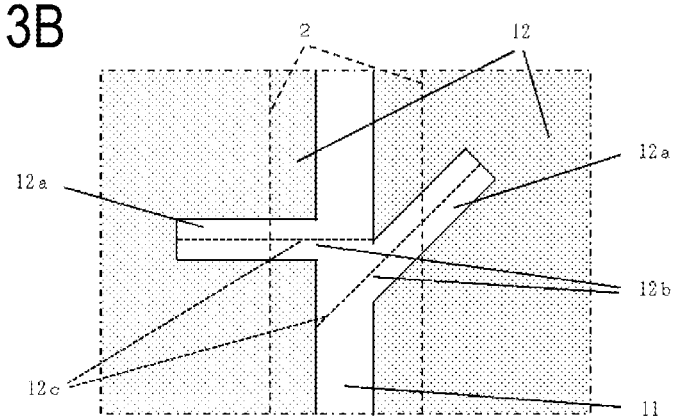
Figure 4A:
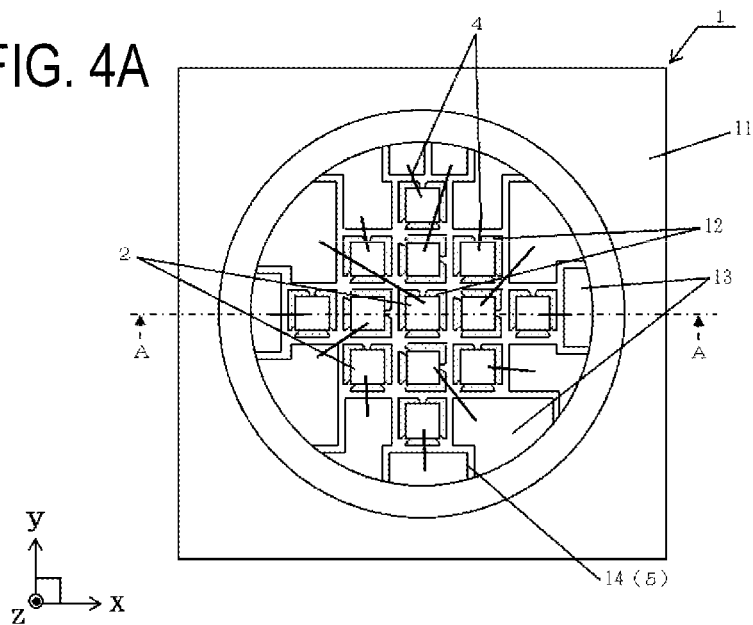
FIG. 4A is a plan view illustrating an electronic device according to a second embodiment of the present invention.
Figure 4B:
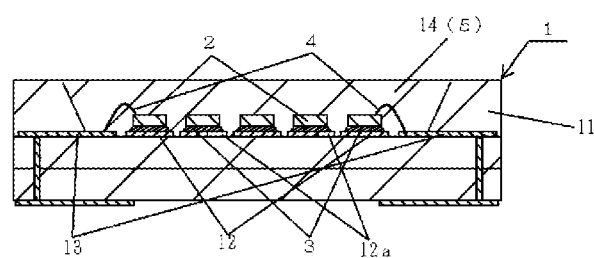
FIG. 4B is a cross-sectional view at the line A-A in FIG. 4A.
Figure 4B:
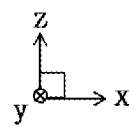
Figure 5A:
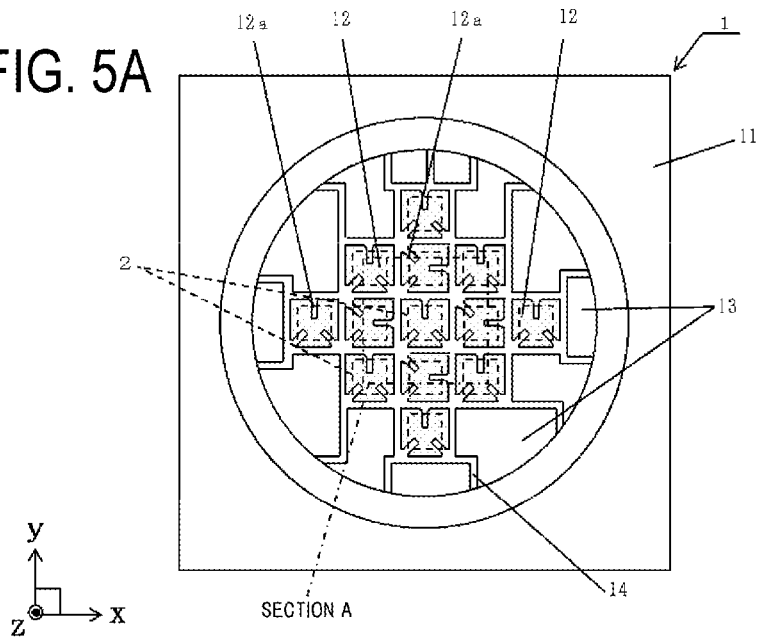
FIG. 5A is a plan view illustrating the wiring board of the electronic device illustrated in FIG. 4A.
Figure 5B:
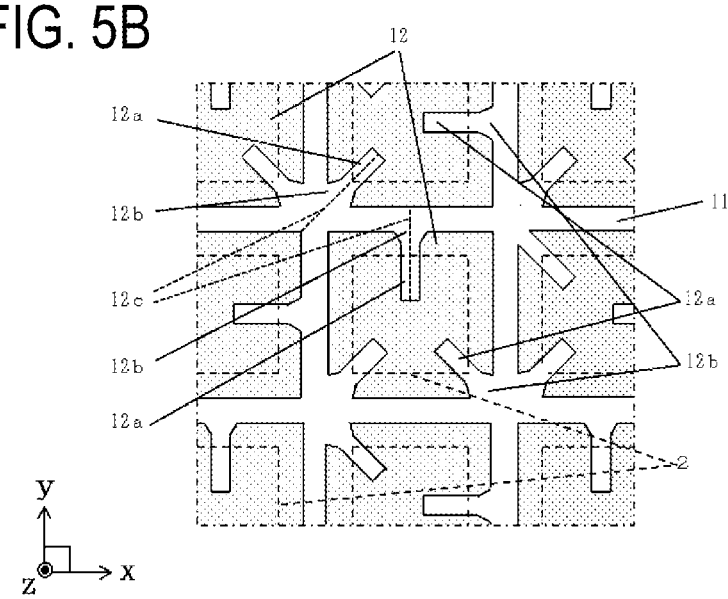
FIG. 5B is an enlarged top view of the main part at section A in FIG. 5A.

Also, as in the example illustrated in FIGS. 2A to 3, in the configuration as described above, when the central line 12*c* drawn from the slit 12*a* at the other electrode 12 intersects with the outer peripheral edge of the first electrode 12, when joining the electronic components 2 to the electrodes 12 using the joining material 3 such as solder, the slit 12a is capable of effectively reducing obstruction of the flow of the gas generated from the joining material 3 on both adjacent electrodes 12, so the occurrence of voids within the joining material 3 can be reduced, which is desirable.

When the slit 12a has the opening 12b at a first end and is closed at a second end, as in the examples illustrated in FIGS. 2A to 3, the joining material 3 such as solder that joins the electronic component 2 to the electrode 12 does not divide into a plurality, so reduction in the joining area of the electronic component 2 is minimized, and the joining reliability of the electronic component 2 is increased. In the present embodiment, the first end of the slit 12a indicates the outer peripheral edge of the electrode 12 side, and the second end of the slit 12a indicates the inside of the electrode 12.

This type of slit 12a can be formed by, for example, printing the pattern of the electrode 12 having the shape with the slit 12a when print-applying the conductor paste for the electrode 12 by the screen printing method onto the ceramic green sheet that will form the insulation base plate 11, as described above.

Also, after forming a rectangular shaped electrode 12, a portion of the electrode 12 can be removed by using cutting processing, laser processing, or etching processing on the surface of the electrode 12 to form the slit 12a having the opening 12b on the surface of the electrode 12.

Here, when the width of the slit 12a is the width in a case where the plated layer has been deposited and is not less than 40 μm in plan view, the gas generated when joining the electronic component 2 to the electrode 12 using the joining material 3 such as solder is released well to the outside. Also, preferably the width of the slit 12a is not more than 200 μm, based on considerations of the joining properties and the heat dissipation properties when joining the electronic component 2 onto the electrode 12.

Also, if the gap in plan view between adjacent electrodes 12 is greater than the width of the slit 12a, the gas released from the slit 12a to between the two electrodes 12 is released well to the outside. The gap between adjacent electrodes 12 is, for example, formed to about from 60 to 300 μm.

Also, the slit 12a may have, for example, a shape that extends from one outer peripheral edge to another outer peripheral edge of the electrode 12 or a shape that comprises a curved portion. However, as illustrated in the example in FIG. 2, when the second end side of the slit 12a extends towards the center of the electrode 12, the gas generated when joining the electronic component 2 onto the electrode 12 by using the joining material 3 such as solder is easily released from the center towards the outer peripheral edge when the electronic component 2 is mounted, which is desirable.

Also, in order to minimize stagnation of the gas within the slit 12a, preferably the width of the slit 12a in plan view is greater than the thickness of the electrode 12.

Also, as illustrated in the example in FIGS. 1A to 2B, when the electrode 12 has a rectangular shape, and the first end of the slit 12a is in a corner of the electrode 12, then the space between the adjacent electrodes 12 has a portion that is wider compared with the case where the first end of the slit 12a is on the outer peripheral edge of the electrode 12 excluding the corners, so the gas is released spreading in four directions between the adjacent electrodes 12, which is desirable. Note that in the present invention, a rectangular shaped electrode 12 indicates the shape of the electrode 12 including the region where the slit 12a is provided.

Also, when the second end of the slit 12a is in the center portion of the electrode 12, as illustrated in the example in FIGS. 2A to 2B, where the gas generated from the joining material 3 on the electrode 12 is difficult to be released when joining the electronic component 2 onto the electrode 12 with the joining material 3 such as solder, the gas can be easily released from a position in the center portion of the electrodes 12 to the outside, thereby minimizing the occurrence of voids in the joining material 3. Note that the center portion of the electrodes 12 indicates a region located in the center of the electrode 12, having a width dimension of not more than ⅖ times that of the electrode 12.

Also, in a case where a plurality of slits 12a are provided in a single electrode 12, when the plurality of slits 12a are dispersed towards the circumferential direction with the centroid of the electrode 12 as center, using the plurality of slits 12a at each of the electrodes 12 allows the gas to be released separately as much as possible.

Note that the insulation base plate 11 may have a top surface that comprises the cavity 14 as illustrated in the example in FIGS. 1A to 2B, as described above. Such a cavity 14 can be formed by forming a through-hole that will form the cavity 14 in a plurality of ceramic green sheets by one of laser processing and punching processing using a die, and laminating these ceramic green sheets on to a ceramic green sheet in which the through-hole is not formed. Also, in a case where the insulation base plate 11 has a small thickness, the through-hole for the cavity 14 can be formed after laminating the ceramic green sheets by laser processing, punching processing using a die, or the like, with good processing accuracy, which is desirable.

In a case where the wiring board 1 has the insulation base plate 11 having a top surface that comprises the cavity 14 in which, for example, a light emitting element is mounted, a reflective layer for reflecting light emitted from the light emitting element may be provided on the inner wall surfaces of the cavity 14. For example, the reflective layer comprises a metal conductive layer and a plated layer deposited on the metal conductive layer provided on the inner wall surfaces of the cavity 14. The metal conductive layer can be formed by using the same material and method as the electrodes 12 and the wiring conductor 13.

Also, in a case where the light emitting element is mounted on the wiring board 1, then preferably for example a silver plated layer is deposited to the outermost surface of the electrodes 12, and a gold plated layer is deposited to the outermost surface of the wiring conductor 13. This is because a gold plated layer has excellent joining properties to the electronic components 2, the connection material 3, and the wiring of the external circuit base plate compared with a silver plated layer, and a silver plated layer has higher reflectivity of light compared with a gold plated layer. Also, a plated layer of a complete solid solution alloy of silver and gold, for example, may be used as an alloy plated layer of silver and gold on the outermost surface of the electrodes 12.

The electronic device is manufactured by mounting the electronic components 2 on the top surface of the wiring board 1. The electronic device comprises the wiring board 1, and the plurality of electronic components 2 mounted on each of the electrodes 12 of the wiring board 1. The electronic components 2 mounted on the wiring board 1 may be semiconductor elements such as IC chips, or LSI chips, light emitting elements, piezoelectric elements such as crystal resonators or piezoelectric oscillators, various types of sensors, and the like. For example, in a case where the electronic components 2 are wire bonded semiconductor elements, after the semiconductor elements are fixed to the electrodes 12 by the joining material 3 such as solder, the electrodes of the semiconductor elements are electrically connected to the wiring conductor 13 using the connection member 4 such as bonding wire, thereby mounting the semiconductor elements on the wiring board 1 to form the electronic device. Note that small electronic components such as resistive elements, capacitative elements, or zener diodes may be mounted on the wiring board 1 as necessary. Also, the electronic components 2 is sealed as necessary by a sealant 5 formed of resin, glass, or the like, a lid body formed of resin, glass, ceramic, metal, or the like.

The electronic components 2 are mounted on the electrodes 12 by reflow after arranging the electronic components 2 on the electrodes 12 with the joining material 3 such as solder, and the slits 12a overlaps with the electronic components 2 in plan perspective. When solder paste or the like is used as the joining material 3, gas is generated from the organic components comprised in the solder paste during reflow.

According to the wiring board 1 of the present embodiment, the wiring board 1 comprises the insulation base plate 11, and the plurality of electrodes 12 provided adjacent to each other in plan view on the insulation base plate 11. The electrodes 12 comprise slits 12a having openings 12b on the outer peripheral edge and are oriented towards the inside from the outer peripheral edge. The central line 12c drawn from a slit 12a in one electrode 12 of a pair of adjacent electrodes 12 intersects with the outer peripheral edge of the other electrode 12. When joining the electronic components 2 to the electrodes 12 by using the joining material 3 such as solder, the slits 12a can reduce the obstruction of gas flow caused by gas generated from the joining material 3 on the adjacent electrodes 12 filling the area near the opening 12b, and release well the gas to the outside, thereby reducing the occurrence of voids within the joining material 3.

The wiring board 1 according to the present embodiment can be advantageously used in particular for the wiring board 1 in which a plurality of electrodes 12 are arranged densely on the top surface of the insulation base plate 11, or for the wiring board 1 in which a plurality of thick electrodes 12 are arranged on the top surface of the insulation base plate 11.

According to the electronic device of the present embodiment, the electronic device comprises the wiring board 1 configured as described above, and the plurality of electronic components 2 mounted on each of the electrodes 12 of the wiring board 1. Therefore the occurrence of voids within the joining material 3 between the electrodes 12 and the electronic components 2 is reduced, and there is a good joint between the wiring board 1 and the electronic components 2, so the electronic device has excellent joining reliability and heat dissipation properties.

In particular, the electronic device according to the present embodiment can be advantageously applied to light emitting devices in which a plurality of light emitting elements are densely mounted so high heat dissipation properties is required.

(Second Embodiment)

Next, the electronic device according to a second embodiment of the present invention is described with reference to FIGS. 4A to 5B.

In the electronic device according to the second embodiment of the present invention, the point of difference from the electronic device according to the first embodiment as described above is that the width in plan view of the slit 12a is greater at the first end side than at the second end side of the electrode 12, as illustrated in the example in FIGS. 4A to 5B. In the example illustrated in FIGS. 4A to 5B, 13 electrodes 12 are provided on the top surface of the insulation base plate 11 in a lattice arrangement with a diamond-shaped external shape of the array.

In the wiring board 1 according to the second embodiment, the width in plan view of the slits 12a is greater at the first end side than at the second end side of the electrode 12, the gas can be released well from the inner side of the electrode 12 towards the outer peripheral edge side. Also, compared with the case in which the width of the slit 12a is made large overall from the first end side to the second end side, the area of the electrode 12 on which the electronic components 2 is mounted is maintained large, so the joining properties between the electrodes 12 and the electronic components 2 with the joining material 3 and the heat dissipation properties from the electronic components 2 to the electrodes 12 can be good. Note that this configuration can also be applied to the first embodiment.

The width of the slit 12a can be made greater on the first end side than the width at the second end side by increasing the width of the slit 12a from the second end side towards the first end side in steps or partially, or by gradually increasing the width from the second end side towards the first end side of the slit 12a. Note that when the width of the slit 12a gradually increases from the second end side of the electrode 12 towards the first end side of the electrode 12, when joining the electronic component 2 to the electrode 12 using the joining material 3 such as solder, the gas generated from the joining material 3 on the electrodes 12 is smoothly released to the outside, thereby reducing the occurrence of voids within the joining material 3.

The electrodes 12 and the slits 12a in the second embodiment are formed by the same method as the first embodiment.

Also, when the width of the slit 12a is increased in the region to the outside of the electronic component 2 in plan perspective, the gas is easily released while maintaining the joining properties and the heat dissipation properties of the electronic device.

Also, in the case where the cavity 14 is a space for mounting light emitting elements, as in the example illustrated in FIGS. 4A to 5B, the angle θ formed between the inner side surfaces of the cavity 14 and the bottom surface of the cavity 14 may be an obtuse angle, and in particular may be in the range 110 to 145°. When the angle θ is in this range, the inner wall surfaces of the through-hole that will form the cavity 14 can be easily formed stably and efficiently by punching processing, thereby reducing the size of the light emitting device using the wiring board 1. Also, this light emitting device can radiate the light emitted from the light emitting elements to the outside well. The cavity 14 having the inner side walls with this angle θ can be formed by punching the ceramic green sheet using a punch and die with the clearance between the diameter of the punch and the diameter of the hole of the die set larger. In other words, by setting the clearance between the diameter of the punch and the diameter of the hole of the die of the punching tools larger, when punching the ceramic green sheet from the main surface side towards the other main surface side, the green sheet is sheared from the edge of the contact surface with the punch towards the edge of the contact surface of the hole of the die, so the diameter of the through-hole is formed increasing from the main surface side towards the other main surface side. At this time, by setting the clearance between the diameter of the punch and the diameter of the hole of the die in accordance with the thickness of the ceramic green sheet and the like, the angle of the inner side surfaces of the through-hole formed in the ceramic green sheet can be adjusted. With this punching method, the angle θ formed between the inner side surfaces of the cavity 14 and the bottom surface of the cavity 14 can be formed to any desired angle by punching processing alone, thereby enhancing the productivity.

Also, the through-hole may be formed expanding from a first main surface side towards a second main surface side with the angle θ as described above, by forming the through-hole with the angle θ about 90° by processing using a punch and die with a small clearance between the diameter of the punch and the diameter of the hole of the die, then pressing a mold with one of a circular truncated cone shape and a truncated pyramid shape into the inner side surfaces of the through-hole. In this case, this method enables more accurate adjustment of the angle θ formed between the inner side surfaces of the cavity 14 and the bottom surface of the cavity 14.

(Third Embodiment)

Figure 6A:
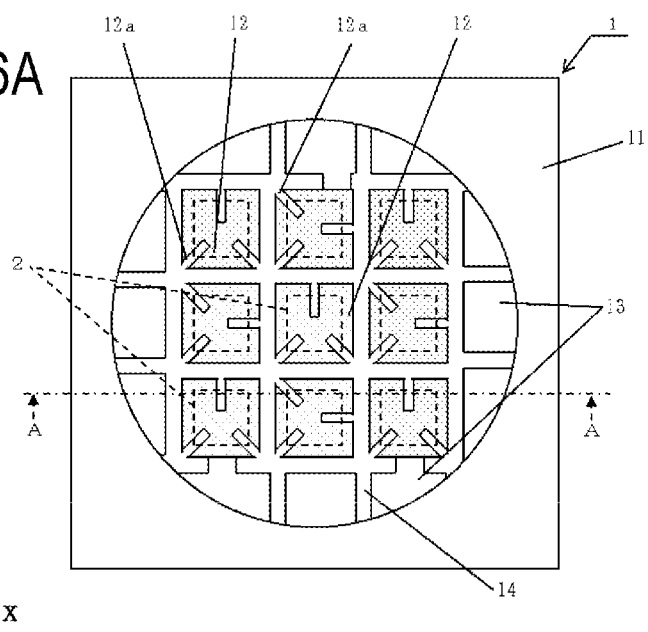
FIG. 6A is a plan view illustrating a wiring board according to a third embodiment of the present invention.
Figure 6B:
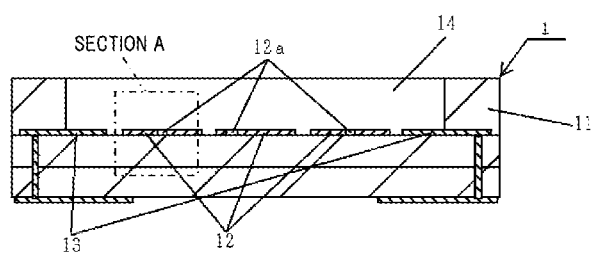
FIG. 6B is a cross-sectional view at the line A-A in FIG. 6A.
Figure 6B:
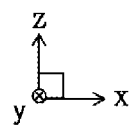
Figure 7:
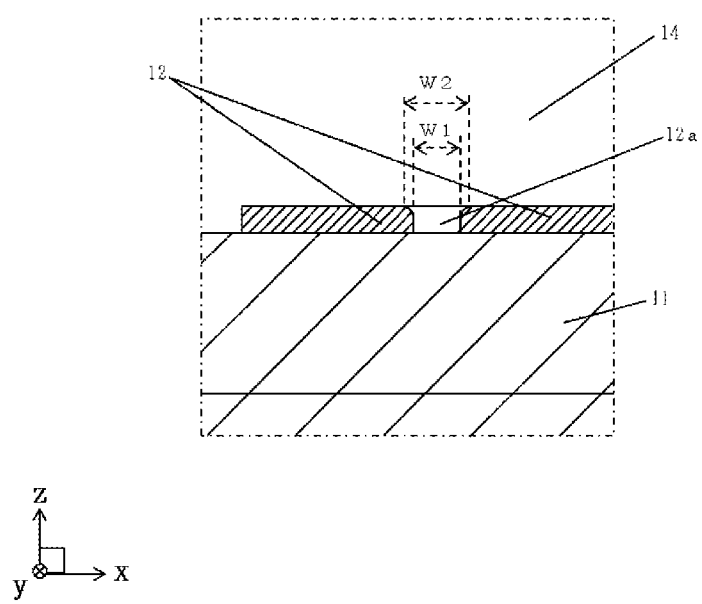
FIG. 7 is an enlarged cross-sectional view of the main part at section A in FIG. 6B.
Figure 8A:
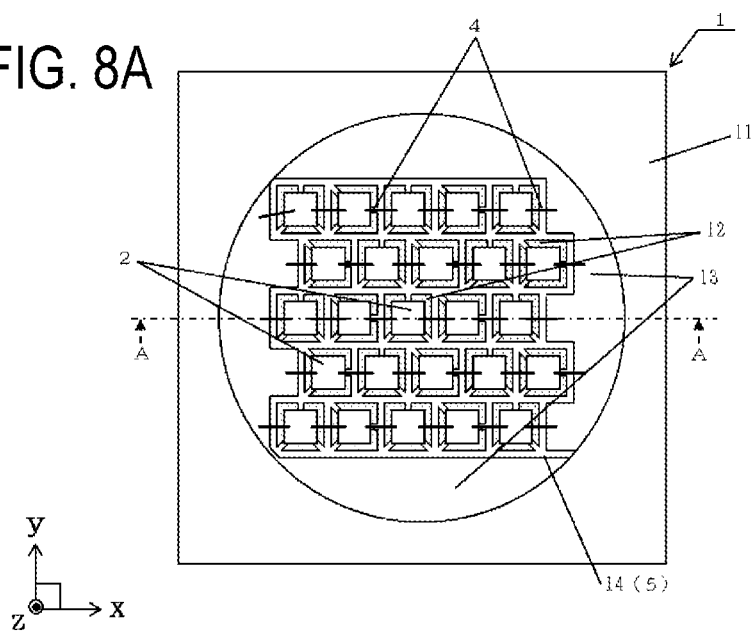
FIG. 8A is a plan view illustrating an electronic device according to a fourth embodiment of the present invention.
Figure 8B:
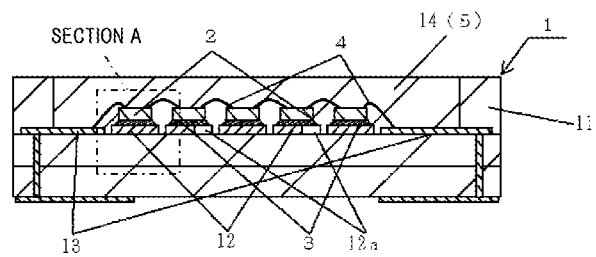
FIG. 8B is a cross-sectional view at the line A-A in FIG. 8A.
Figure 8B:
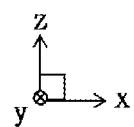
Figure 9A:
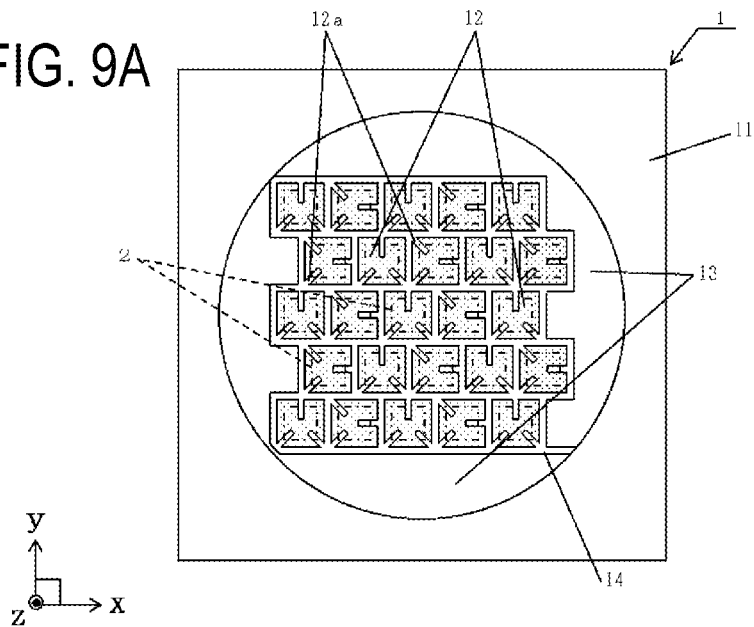
FIG. 9A is a plan view illustrating the wiring board illustrated in FIG. 8A.
Figure 9B:
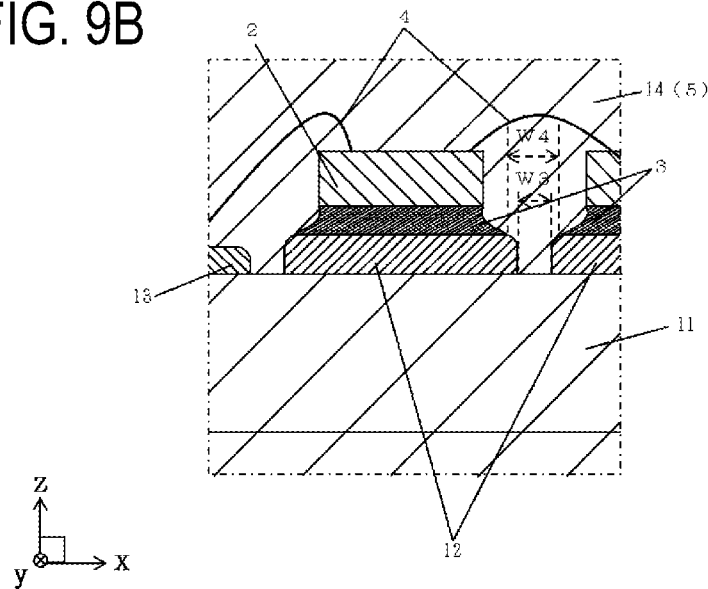
FIG. 9B is an enlarged cross-sectional view of the main part at section A in FIG. 8B.

Next, the wiring board according to a third embodiment of the present invention is described based on FIGS. 6A to 7.

In the wiring board according to the third embodiment of the present invention, as illustrated in FIGS. 6A to 7, the points of difference from the wiring board according to the embodiments described above are the width of the slit 12a in cross-sectional view is greater at the electrode 12 top surface side W2 than at the insulation base plate 11 side W1, and several of the electrodes 12 arranged on the outermost periphery from among the plurality of electrodes 12 are connected to the wiring conductor 13 arranged around the periphery. In the example illustrated in FIGS. 6A to 7, nine electrodes 12 are provided in a lattice arrangement of 3 columns×3 rows on the surface of the insulation base plate 11.

In the wiring board 1 according to the third embodiment, the width of the slits 12a in a cross-sectional view is greater at the electrode 12 top surface side W2 than at the insulation base plate 11 side W1, thereby easily releasing the gas from the slit 12a upwards and reducing the occurrence of voids within the joining material 3. Note that this configuration can also be applied to the first embodiment and the second embodiment.

Also, when the slits 12a provided in the electrodes 12 that are connected to the wiring conductor 13 arranged around the periphery are provided in the outer peripheral edge where the connection portion between the electrode 12 and the wiring conductor 13 is formed, the flow of fluid will be obstructed by the connection portion, so preferably the slits 12a are provided in one of the outer peripheral edge and the corners excluding the outer peripheral edge where the connection portion is formed.

(Fourth Embodiment)

Next, the electronic device according to a fourth embodiment of the present invention is described with reference to FIGS. 8A to 9B.

In the electronic device according to the fourth embodiment of the present invention, the points of difference from the electronic device according to the embodiments described above are, as illustrated in the example in FIGS. 8 and 9, the gap between adjacent electrodes 12 in cross-sectional view is greater at the electrode 12 top surface side W4 than at the insulation base plate 11 side W3, and the rows of the electrodes 12 are displaced in the horizontal direction. In the example illustrated in FIGS. 8A to 9B, 25 electrodes 12 are provided in a lattice arrangement of 5 columns×5 rows on the surface of the insulation base plate 11.

In the wiring board 1 according to the fourth embodiment, the gap between adjacent electrodes 12 in cross-sectional view is greater at the electrode 12 top surface side W4 than at the insulation base plate 11 side W3, so the gas between the electrodes 12 can be easily released upwards, so there is good release of the gas from the slits 12a to the outside via the space between electrodes 12, thereby reducing the occurrence of voids within the joining material 3.

Also, providing the openings 12b of the slits 12a in positions between the adjacent electrodes 12, as in the example illustrated in FIGS. 8A to 9B, allows the gas to be released well from the slits 12a to the space between the electrodes 12.

In addition, making the gap between adjacent electrodes 12 greater than the width of the slits 12a allows the gas to be released well from the slits 12a to the space between the electrodes 12.

Figure 1B:
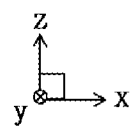

The present invention is not limited to the examples of the embodiments as described above, and various modifications can be made. The wiring board 1 may also be provided with conductors other than wiring such as a central terminal 15, as illustrated in FIG. 1. For example, the central terminal 15 can be manufactured using the same material and method as the electrodes 12 and the wiring conductor 13 as described above, with a plated layer applied to the exposed surface thereof, the same as for the electrodes 12 and the wiring conductor 13. The central terminal 15 can be used, for example, for connecting to an external circuit base plate, the same as for the wiring conductor 13.

Figure 10A:
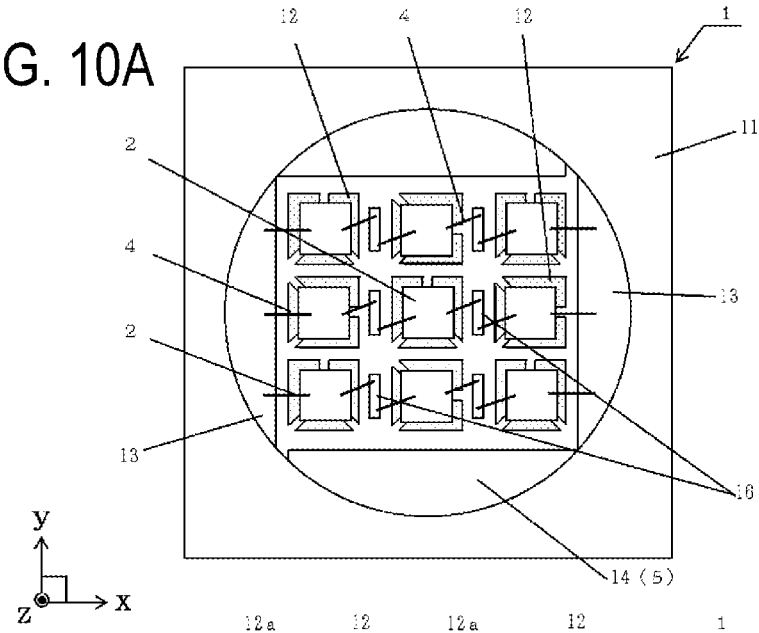
FIG. 10A is a plan view illustrating another example of electronic device according to the first embodiment of the present invention.
Figure 10B:
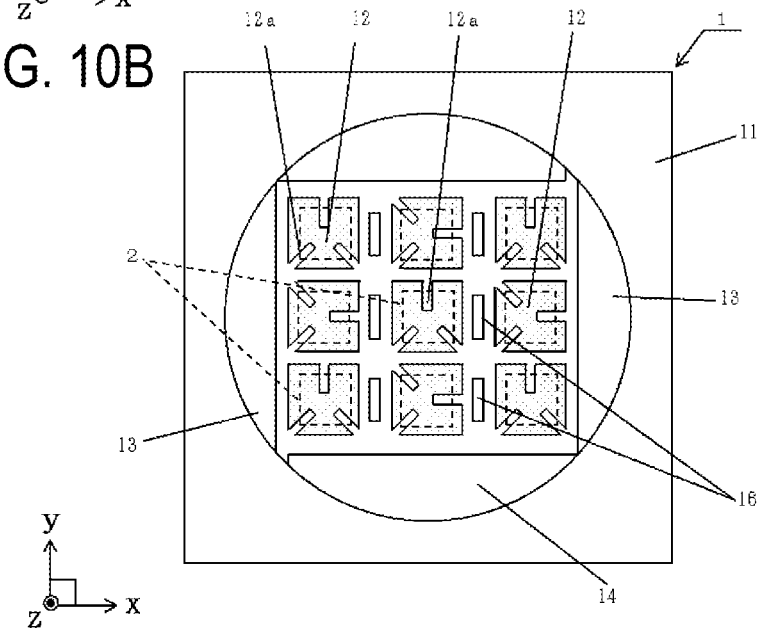
FIG. 10B is a plan view illustrating the wiring board of the electronic device illustrated in FIG. 10A.

Also, a metal layer 16 maybe provided between the plurality of electrodes 12, as in the example illustrated in FIG. 10. Note that the metal layer 16 has a region connected to the connection member 4, and does not have a slit.

The metal layer 16 can be manufactured using the same material and method as the electrodes 12 and the wiring conductor 13 as described above, with the plated layer deposited to the exposed surface thereof, the same as for the electrodes 12 and the wiring conductor 13. For example, the metal layer 16 can be used as a region for connecting the connection member 4 to the electrode of an electronic component 2 between the electrodes 12 for mounting the electronic components.

Also, the metal layer 16 may be partially connected to one of the electrodes 12 and the wiring conductor 13.

Also, in the examples described above, the second end portion of the wiring conductor 13 is brought to the bottom surface of the insulation base plate 11, but it may also be brought to the side surface of the insulation base plate 11. For example, a groove may be provided in the side surface of the insulation base body 11, and a conductor may be provided on the inner surfaces of the groove, to form a so-called castellation conductor.

Also, in a case where the second end portion of the wiring conductor 13 is brought to the top surface side, it may be connected to an external circuit base plate on the top side of the wiring board 1. Such a wiring board 1 can be connected to an external circuit base plate on the top surface side of the wiring board 1, thereby improving the heat dissipation properties of the wiring board 1 by connecting a member with a higher thermal conductivity than that of the insulation base plate 11 over the whole surface of the bottom surface side of the wiring board 1. In a case where the insulation base plate 11 is formed of an aluminum oxide-based sintered body, then a metal material such as copper (Cu), copper-tungsten (Cu—W), or aluminum (Al), or an insulation base plate made from an aluminum nitride-based sintered body or the like, can be used as the material with a thermal conductivity higher than that of the insulation base plate 11.

Also, in the wiring board 1, metal members with heat dissipation properties better than that of the insulation base plate 11 may be embedded within the insulation base plate 11 in regions that overlap with the regions where the plurality of electronic components 2 are mounted in plan view.

Also, the wiring board 1 may be manufactured in the form of a multipiece wiring board.

REFERENCE SIGNS LIST

1: Wiring board
11: Insulation base plate
12: Electrode
12a: Slit
12b: Opening
12c: Central line drawn from the slit
13: Wiring conductor
14: Cavity
15: Central terminal
16: Metal layer
2: Electronic component
3: Joining material
4: Connection member
5: Sealant

The invention claimed is:

1. A wiring board, comprising:
an insulation base plate; and
a plurality of electrodes provided adjacent to each other on the insulation base plate;
the electrodes each comprising a respective slit that includes an opening on an outer peripheral edge of the electrode and is oriented towards an interior portion of the electrode, wherein a first central line drawn from a first slit in a first electrode of a pair of adjacent electrodes intersects with the outer peripheral edge of a second electrode of the pair, a second central line drawn from a second slit in the second electrode in with the outer peripheral edge of the first electrode, and the first central line and the second central line irrtersect with each other, and
wherein a gap between the first electrode and the second electrode is greater at an electrode top surface side than at an insulation base plate side of the first electrode and the second electrode.

2. The wiring board according to claim 1, wherein the first slit comprises the opening at a first end, and is closed at a second end.

3. The wiring board according to claim 2, wherein the first slit extends towards a center of the first electrode.

4. The wiring board according to claim 3, wherein the first electrode has a rectangular shape, and the first end of the first slit is in a corner of the first electrode.

5. The wiring board according to claim 3, wherein the second end of the first slit is situated in a central portion of the first electrode.

6. The wiring board according to claim 2, wherein a width of the first slit at the opening is greater than the width of the first slit at the second end.

7. The wiring board according to claim 6, wherein the width of the first slit gradually increases from the second end of the first slit towards the opening of the firs slit.

8. The wiring board according to claim 1, wherein the first electrode comprises a plurality of slits, each slit in the plurality starting at a periphery of the first electrode and extending towards an interior portion of the first electrode.

9. The wiring board according to claim 1, wherein a width of the first slit is greater at the electrode top surface side than at the insulation base plate side.

10. An electronic device, comprising:
the wiring board described in claim 1; and
a plurality of electronic components mounted on each of the electrodes of the wiring board.

11. The electronic device according to claim 10, wherein the first slit overlaps with at least one of the electronic components.

* * * * *